US005652185A

United States Patent [19]

Lee

[11] Patent Number: 5,652,185
[45] Date of Patent: Jul. 29, 1997

[54] MAXIMIZED SUBSTRATE DESIGN FOR GRID ARRAY BASED ASSEMBLIES

[75] Inventor: Shaw Wei Lee, San Jose, Calif.

[73] Assignee: National Semiconductor Corporation, Santa Clara, Calif.

[21] Appl. No.: 418,818

[22] Filed: Apr. 7, 1995

[51] Int. Cl.$^6$ .................................................. H01L 21/60
[52] U.S. Cl. ........................ 437/219; 437/209; 437/211; 437/214; 437/217
[58] Field of Search ........................ 437/209, 211, 437/214, 215, 217, 219, 220

[56] References Cited

U.S. PATENT DOCUMENTS

| | | | |
|---|---|---|---|
| 4,331,740 | 5/1982 | Burns | 437/220 |
| 5,036,380 | 7/1991 | Chase | 437/220 |
| 5,057,456 | 10/1991 | Dehaine | 437/220 |
| 5,286,680 | 2/1994 | Cain | 437/220 |
| 5,339,518 | 8/1994 | Tran et al. | 437/217 |
| 5,382,546 | 1/1995 | Yamada et al. | 437/217 |

Primary Examiner—Kevin Picardat
Attorney, Agent, or Firm—Hickman Beyer & Weaver

[57] ABSTRACT

A method of packaging a BGA assembly, with a substrate that has been formed from a substrate strip whose area has been maximized, is disclosed herein. In a first embodiment, the method includes forming individual units by punching stress relief slots around the periphery of the units on the strip. The slots perform a dual function of providing stress relief during manufacturing and serve as boundaries between the individual units to eliminate excess material between units. The units are attached to the substrate by support sites that are subsequently punched to separate the individual units from the strip thereby simplifying the separation operation. Thus a relatively simple operation of punching the support sites instead of punching out around the entire device can be used to singulate the units. This decreases the punching force necessary for separation which reduces likelihood of substrate damage and increases the life of the punching tool. Further, the design results in significant savings by efficient substrate utilization to increase the number of units that will fit on a strip thereby increasing yield.

16 Claims, 4 Drawing Sheets

MAXIMIZED SUBSTRATE DESIGN FOR GRID ARRAY BASED ASSEMBLIES

BACKGROUND OF THE INVENTION

This invention relates generally to substrates for use in Ball Grid Array integrated packages. More particularly, it relates to a technique which more efficiently utilizes the area of Ball Grid Array substrates.

As technology advances, the functionality, complexity and speed of integrated circuit (IC) chips are steadily increasing. These increasingly complex, high speed IC chips often require correspondingly increasing numbers of electrical interconnections in which to communicate with other components. Consequently, high density interconnect package assemblies and the trend toward miniaturization have been principal objectives of the semiconductor industry. One such package developed to meet these objectives is the Ball Grid Array (BGA) integrated assembly.

FIG. 1 shows a cross section of a high interconnect density BGA package, generally referred to by reference number 10. The package includes an integrated circuit die 12 affixed to and supported by a dielectric substrate 14. Die 12 includes a plurality of bond pads (not shown) which are connected to the active circuitry within the die. Substrate 14 includes a plurality of conductive traces 16 that are formed from a thin solder mask layer disposed on the top surface of the substrate 14. The conductive traces 16 are subsequently formed for connection with bonding wires 18 that are connected to the bond pads of the die 12. On the bottom surface of substrate 14 are a multiplicity of solder balls 20 attached thereto in a dense grid pattern. The solder balls 20 are arranged to be received on a circuit board having matching electrical contacts. This dense grid arrangement serves to provide the package with electrical communication to the outside world and is the basis for the high interconnect density of the BGA package. The conductive traces 16 are connected to the solder balls 20 by way of vias (not shown) routed through or around the substrate 14. A plastic material is molded over the device, which in cooperation with the substrate 14, encapsulates the device to protect it from the outside environment.

With the basic BGA structure given above, it is generally the case that the substrate constitutes a major part of the cost (about 85% or so) of the package. This is especially true of substrates constructed of Bismaleimid Triazine (BT), which is a relatively expensive material. The advantage of BT is that it possesses a relatively high glass transition temperature ($T_g$) of about 180° C. as opposed to FR4 which is widely used for printed circuit boards which has a glass transition temperature of about 150° C., for example. A high glass transition temperature is required during manufacturing where the molding process temperatures can reach 170°–180° C.

FIG. 2 illustrates a typical substrate used in BGA packages generally designated by reference numeral 24. Substrates are generally supplied in strip form with typically anywhere from 3–7 units per strip. A strip configuration is used because it is more conducive to processing by automation where the equipment can process multiple units efficiently as opposed to individual processing. The particular substrate shown in FIG. 2 is supplied by Shinko Electric of Japan designated as part number 313 BGA. Holes 26 are punched near the edges of strip 24 so that the processing equipment can grasp and align the part during manufacturing. Stress relief slots 28 are punched periodically between units 30 which allow for expansion when subjected to the high processing temperatures during the molding operation. It can be seen that two slots are punched in between units thereby leaving material area 32 unused. After the packages are formed, the final step is to separate the units 30 from the strip by a punching operation that punches out the part all the way around which is referred to as singulation or separation. Since the BT substrate material is very tough, the singulation step can result in substrate and solder mask cracking and depart undue wear and stress on the punching apparatus and possibly shorten tool life prematurely. As the substrate thickness increases, the problems described above only get worse.

FIG. 2a illustrates a substrate used in BGA packages manufactured by Anam of Industrial Co. of Korea. In contrast to the Shinko design, single stress relief slots 28 are located between and above and below units 30. A similar manufacturing process is performed as with the Shinko substrate in FIG. 2 where the final step is to punch out the individual packages. Index holes 27 are used for the purpose of positioning the punch to the correct location around the unit prior to punching out the package. Since the packages are punched out all the way around, the same shortcomings exist as in the previous substrate 24.

With the relative high cost of substrate material and undue wear imposed during the punching operation, what is needed is a more efficient use of substrate area so that less material is wasted during manufacturing. What is further needed is a simplified punching operation that reduces the stresses inflicted on the substrate and punching equipment to reduce the possibility of substrate damage. As will be described hereinafter, the present invention, in accordance with the above objectives, may yield significant savings in the cost of manufacturing such a package.

SUMMARY OF THE INVENTION

To achieve the foregoing and other objectives and in accordance with purpose of the present invention, a method of packaging a BGA assembly comprising a substrate that has been formed from a substrate strip whose area has been maximized, is disclosed herein. In a first embodiment of the present invention, the method includes creating a substrate strip comprised of contiguously adjacent units by forming stress relief slots along the periphery of the units such that the stress relief slots also serve as unit boundaries which eliminates unused space between units. The adjacent units of the substrate strip are perforated by the slots formed in the substrate at the periphery of the units and as common boundaries in between. The slots are punched all the way around the unit except for support sites that are left intact at the corners of the unit for attaching the unit to the substrate. These support sites are subsequently punched to separate the individual units from the strip. This permits a relatively simple procedure of punching the support sites instead of punching out around the entire device which greatly simplifies the separation operation.

In a preferred embodiment, an integrated circuit device is then affixed to the top surface of the substrate and wire bonded to conductive traces disposed on the top surface of the substrate. A multiplicity of solder balls are attached to the bottom surface of the substrate in a predetermined grid pattern which are to be received by matching contacts on a circuit board. An encapsulating material is molded or placed over the die, electrical coupling, and conductive traces such that the cap and substrate cooperate to seal the device from the outside environment. The strip is trimmed by punching the support sites to detach the individual devices from the strip. The solder balls can be attached to the substrate bottom either prior to or after the trimming step.

In an apparatus aspect of the invention, a dielectric substrate for use in BGA integrated circuit packages is provided that includes a multiplicity of contiguously adjoining units formed into a substrate strip. The units are perforated by stress relief slots formed into the substrate at the periphery of the units such that they also serve as common boundaries between units. The units remain attached to the substrate by support sites at the corners of the unit. This arrangement eliminates excess substrate material in between units. The support sites are eventually punched to separate the individual units from the strip thus simplifying the detachment operation.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE PREFERRED EMBODIMENTS

Figure 1:
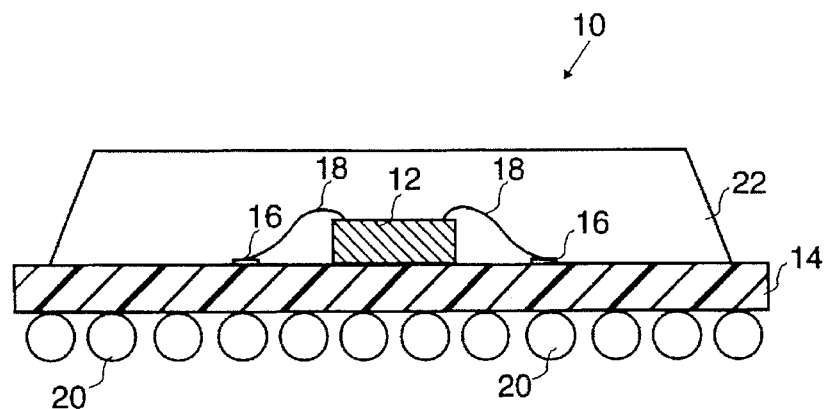
FIG. 1 is a diagrammatic cross sectional view of a BGA Package.
Figure 2:
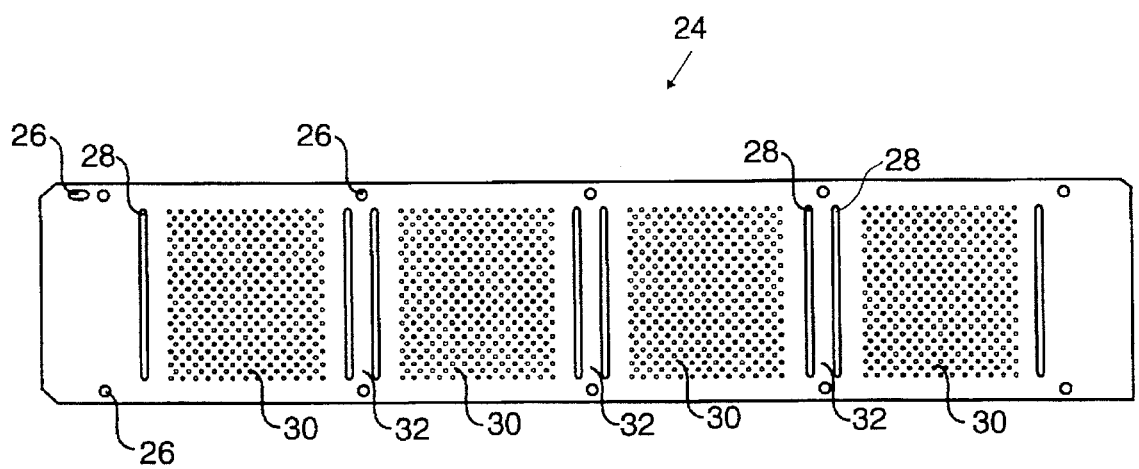
FIG. 2 is a diagrammatic top view of a prior art four unit per strip substrate having multiple stress relief slots between units.
Figure 2A:
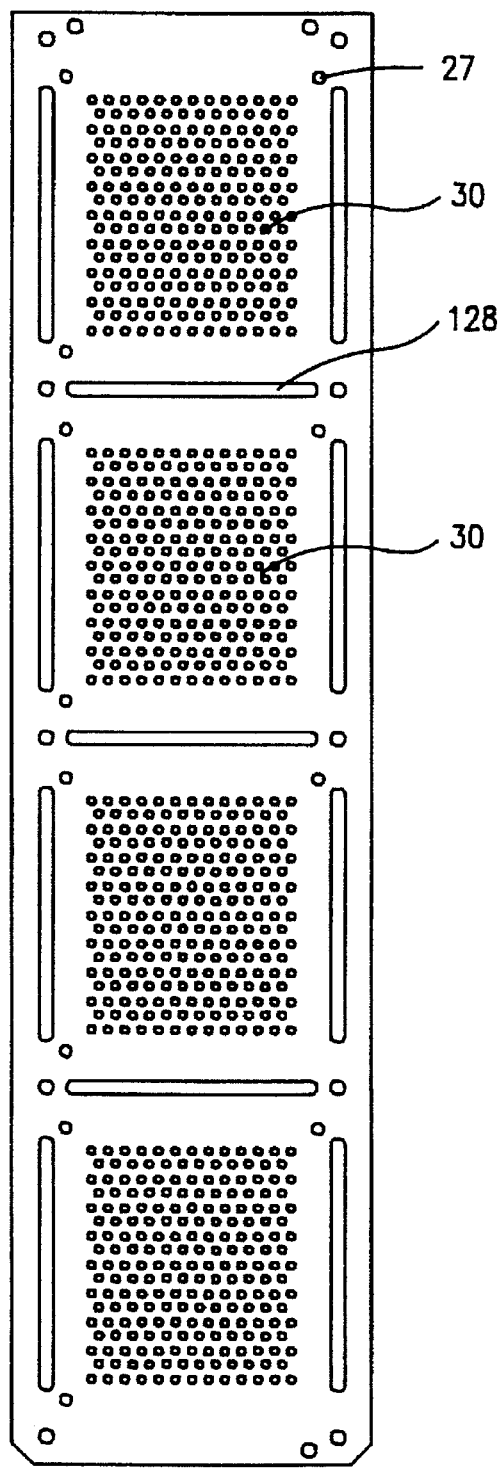
FIG. 2a is a diagrammatic top view of a prior art substrate strip having single stress relief slots between units.
Figure 3:
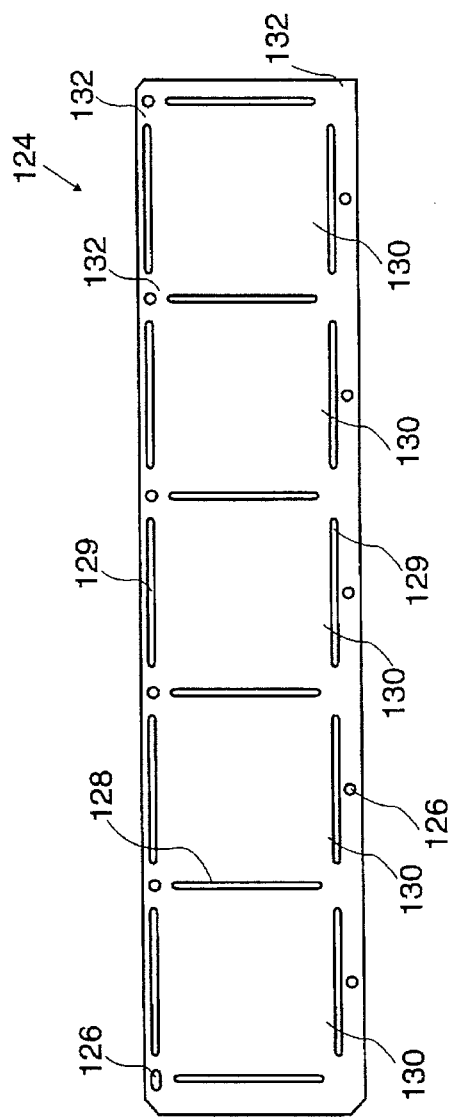
FIG. 3 is a diagrammatic top view of a five unit per strip substrate in accordance with the present invention.

A discussion of FIGS. 1 and 2 directed toward a BGA package was provided in the preceding sections. Referring now to FIG. 3, generally referred to as 124 and in accordance with the present invention, a multi-unit substrate strip for use in BGA packages is shown. In a first embodiment, the substrate 124 may be constructed from a variety of substrate materials used in the semiconductor industry as long as the substrate glass transition temperature that is greater the highest temperature it will be subjected to during manufacturing. This is typically the molding temperature during the molding process. By way of example, one preferred embodiment, BT rosin CCL-H832 with TAIYO PSR4000 AUS5 manufactured by Eastern of Nagano, Japan, may be used as the substrate material. The BT rosin has a glass transition temperature of about 180° C. It has been found that a strip of contiguous units is an efficient configuration which best aids processing with the automation equipment, as opposed to processing individual units. The number of units per strip may vary depending on the package body size. A configuration of multiple rows and columns may be designed into a matrix substrate frame. Care should be taken in the selection of the configuration since defect rates tend to increase with increasing numbers of units in the strip or panel.

The units 130 are positioned directly adjacent one another contiguously with each unit sharing a boundary with the one next to it. In the first embodiment and in accordance to the present invention, stress relief slots 128 are formed into the substrate 124. The stress relief slots also serve as boundaries between units. Stress relief slots 128 are necessary because thermal expansion of the substrate, package molding, and wire traces occurs when they are subjected to high temperatures during manufacturing. These slots 128 compensate for the stresses that build up due to expansion mismatch thus preventing the assembly from warping and cracking. Further, slots 129 are formed above and below unit 130, which in conjunction with the boundary stress relief slots 128, form a rectilinear unit whereby each unit remains attached to the substrate at four support sites 132. Each of the units 130 on the strip are perforated by slots 128 in this fashion. Formation of slots 128 and 129 are typically formed by punching through the substrate with a punching apparatus although other methods, such as routing, may be used to form the slots. In addition, guide or alignment holes 126 are punched into the substrate 124 at the same time the slots are formed. The guide holes 126 are used by processing equipment for alignment purposes so that the strips can be processed sequentially by automation.

After slots 128 have been punched into the strip 124, an IC die (as best seen as 12 in FIG. 1) is affixed to the top surface of each unit 130. Substrate 124 has a series of conductive traces 16 (shown in FIG. 1) formed thereon which are wire bonded to the die 12 to provide input/output interconnectivity to the package. The traces are connected through vias (not shown) to solder balls (like those in FIG. 1 shown as 16 and 20 respectively) are attached in a grid pattern to the bottom surface of substrate 124. The solder balls, when mounted on and received by a circuit board, provide the package with greater I/O than leadframe packages such as Quad Flat Packs, for example. Solder balls may be constructed from a variety of types of solder used in the industry. By way of example, various lead/tin solders such as 63% Sn-37% Pb and 62% Sn-36% Pb-2% Ag have been found to work well. High I/O leadframe packages become increasingly harder to handle because the leads tend to get thinner, more closely spaced, and are prone to being bent or broken. Consequently BGAs are increasingly being used in applications where I/O is typically greater than about 208 leads.

Figure 4:
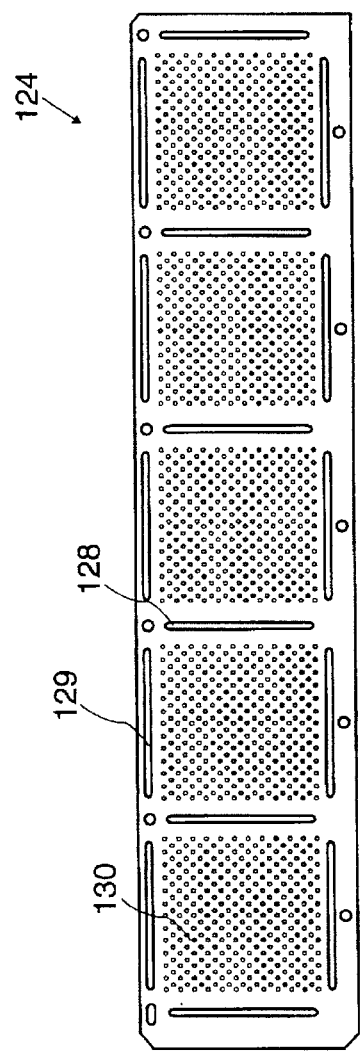
FIG. 4 is a diagrammatic bottom view of the substrate strip of FIG. 3 showing solder ball attachment sites.

Referring now to FIG. 4, a molding operation is performed on the top surface of the strip so that each of the devices are encapsulated with a cap which cooperates with the substrate to protect the device from the outside environment. The molding material may be of any suitable encapsulating material used in the semiconductor industry such as plastics, epoxies, and polymides. A plastic encapsulant works well and is used in the present embodiment since it can be cost effectively applied by injection molding. Alternatively, ceramic or metal caps can be used to encapsulate the die as will be appreciated by those skilled in the art. The bottom surface of strip 124 are then attached with solder balls 120 in each of the units 130 which are separated by stress relief slots 128.

At this point the formed devices reside in each of units 130 of strip 124 and are ready to undergo a trimming operation to separate the units from the strip. The separation process is performed by securing the substrate 124 and punching out the support sites 132 from the ends of the boundary slots 128 to the ends of the horizontal slots 129. Typically this is done by a 45° chamfer punch but can be replaced by a 90° perpendicular trim or other suitable angle trims.

Figure 7:
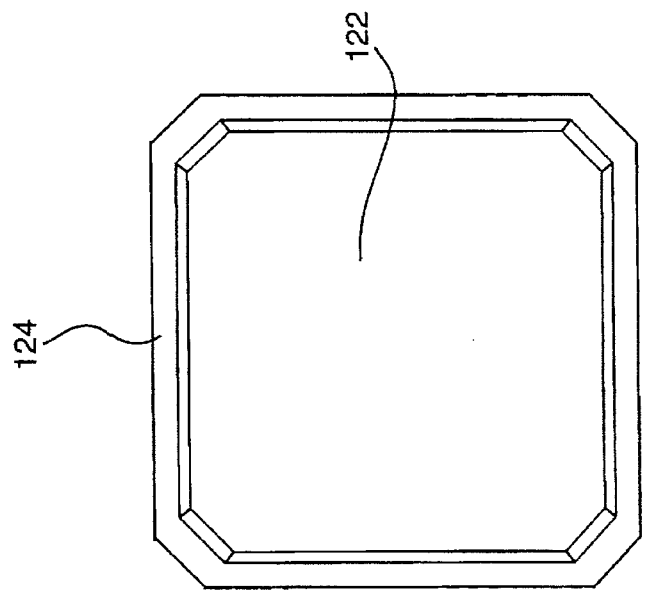
FIG. 7 is a diagrammatic top view of the unit of FIG. 5 showing the molded cap.
Figure 6:
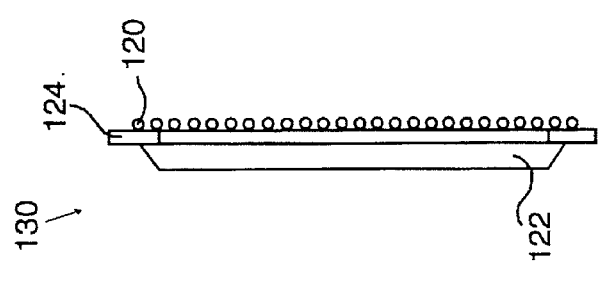
FIG. 6 is a diagrammatic side view of the unit of FIG. 5 showing a formed BGA package.
Figure 5:
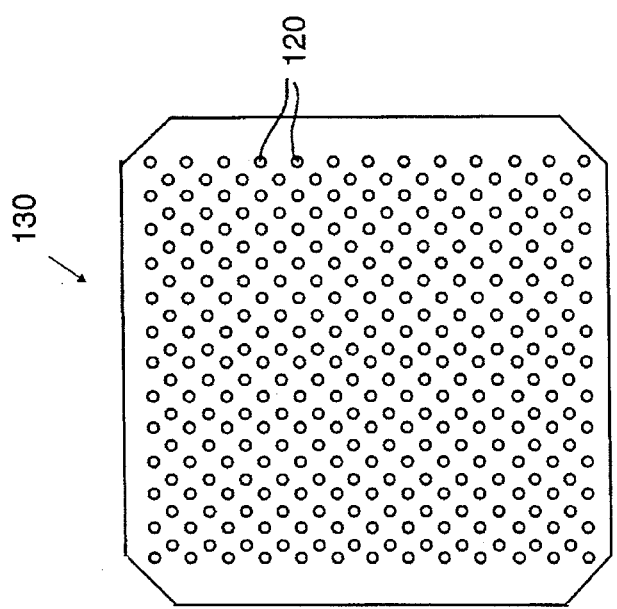
FIG. 5 is a diagrammatic bottom view showing attached solder balls of an individual unit punched from a strip in accordance with the present invention.

FIG. 5 is a bottom view (showing the solder bails 120) of the resulting unit 130 after trimming with a 45° chamfer 125. The optional 90° perpendicular trim is shown as a dashed outline 123. In essence, the corners of the unit have been cut off which results in unit 130 resembling an eight sided polygon. FIG. 6 is a side view of the formed package showing the plastic encapsulation 122 on the top surface and solder balls 120 on the bottom surface of the substrate 124. The thickness of the substrate 124 may vary depending on the particular application and desired height of the package. Of course the thicker the substrate the harder it will be to punch. By way of example, a thickness of 0.55 mm±0.05 mm works well. The thickness of the solder bails and the encapsulation can be widely varied as required for particular applications by way of example a solder ball thickness of 0.60 mm and an encapsulation thickness of 1.17 mm may be used for a total package thickness of 2.33 mm. FIG. 7 is a top view of unit 130 showing encapsulation 122 and substrate 124. The dimensions of unit 130 is 35 mm square for side to side and an encapsulation dimension of 30 mm square. Again, these particular values may vary according to the specific application requirements.

The above discussion was directed toward a method of maximizing substrate area by exploiting the use of stress relief slots to double as unit boundaries. The design enables more efficient substrate utilization which permits more units per strip and it simplifies the separation operation by reducing the punching force by about 25%, compared to current processing methods of previous substrates. The increase in yield reduces costs which can be very significant when operating in mass production.

While the invention has been described primarily in terms of a Ball Grid Array package, it should be understood that the invention may be applied to other types of packages that include substrates. Further while only one embodiment of the present invention has been described in detail, it should be understood that the present invention may be embodied in other specific forms without departing from the spirit or scope of the invention. Particularly, the units need not be rectilinear but may take any form suitable for specialized applications and that the geometries of the slot patterns may vary or the substrate can be a matrix design in strip or panel form, for example. Further, it should be understood that the present invention is not limited to the dimensions recited. Also within the scope of the previous discussion is the application of the present invention to multi-chip packages which support multiple die in single packages. Therefore, the present examples are to be considered as illustrative and not restrictive, and the invention is not to be limited to the details given herein, but may be modified within the scope of the appended claims.

What is claimed is:

1. A method of packaging a Grid Array based integrated circuit device comprising the steps of:
    (a) forming stress relief slots in a substrate assembly to define adjacent individual units wherein said slots are formed around a substantial portion of the periphery of said unit such that portions remain to form support sites to attach the units to the substrate, wherein some of said slots define boundaries between adjacent ones of said units and wherein side edges of the slots that define boundaries between adjacent units are edges of such units, the slots serving to relieve stress due to thermal expansion during high temperature processing, said substrate having top and bottom surfaces wherein said top surface includes a plurality of conductive traces thereon;
    (b) affixing an integrated circuit device to the top surface of said substrate;
    (d) attaching a multiplicity of solder units to the bottom surface of the substrate in a predetermined grid pattern;
    (c) electrically coupling the device to said conductive traces, each said conductive trace being electrically connected to an associated solder unit on the bottom surface of said substrate;
    (e) encapsulating the die, electrical coupling, and conductive traces such that the cap and the substrate cooperate to seal the device from the outside environment; and
    (f) trimming said support sites such that the units are detached from the substrate as individual packages, wherein the trimming is accomplished by cutting between the stress relief slots such that a substantial portion of the periphery of each unit is formed by the stress relief slots.

2. A method of packaging a Grid Array based integrated circuit device according to claim 1 wherein the substrate assembly is in the form of a strip such that the individual units are positioned contiguously on said strip to aid in processing by automation.

3. A method of packaging a Grid Array based integrated circuit device according to claim 2 wherein said slots are formed around said individual units in a rectilinear fashion such that the support sites are located at the corners of the unit.

4. A method of packaging a Grid Array based integrated circuit device according to claim 3, wherein said slots are formed along each side of the individual unit, the number of the slots being at most four, and wherein said support sites are formed between the respective ends of adjacent ones of the slots.

5. A method of packaging a Grid Array based integrated circuit device according to claim 4, wherein four of said slots are provided, with each slot corresponding to an associated side of the individual unit, and wherein said support sites are formed at the four corners of the individual unit.

6. A method of packaging a Grid Array based integrated circuit device according to claim 4, wherein said trimming is executed by cutting said support sites, and wherein the trimmed units have at least six sides.

7. A method of packaging a Grid Array based integrated circuit device according to claim 5, wherein said trimming is executed by cutting said support sites, and wherein the trimmed units consists of eight sides.

8. A method of packaging a Grid Array based integrated circuit device according to claim 3 wherein the trimming is performed by punching out the support sites at corners of the unit thereby separating the unit from the strip.

9. A method of packaging a Grid Array based integrated circuit device according to claim 1 wherein the substrate assembly is in panel form and wherein the individual units are arranged in a matrix.

10. A method of packaging a Grid Array based integrated circuit device according to claim 1 wherein said slots are formed by one from the group consisting of punching, routing, and machining.

11. A method of packaging a Grid Array based integrated circuit device according to claim 1 wherein the cap is plastic.

12. A method of maximizing substrate area on a strip for use in Grid Array based integrated circuit packages, comprising the steps of:
    designating substrate area into juxtaposed individual units wherein each individual unit corresponds to a substrate area for use in a single Grid Array based package;

forming slots in said substrate along periphery of individual units wherein said slots are formed around a substantial portion of the periphery such that support sites remain to attach the units to the substrate; and whereby at least some of said slots serve to form boundaries between adjacent units after the units are detached from the substrate and to relieve stress during to thermal expansion in high temperature processing thereby eliminating excess substrate material between units and simplifying the unit separation operation, wherein said support sites are punched to separate the unit from the strip.

13. A method of maximizing substrate area according to claim 12 wherein the individual units are aligned contiguously on said strip to aid in processing by automation.

14. A method of maximizing substrate area according to claim 12 wherein said slots are formed by punching.

15. A method of maximizing substrate area according to claim 14 wherein said slots form a rectilinear periphery around, said individual units.

16. A method of maximizing substrate area according to claim 12 wherein said slots are linear.

* * * * *